(12) United States Patent
Wang et al.

(10) Patent No.: US 12,048,177 B2
(45) Date of Patent: Jul. 23, 2024

(54) OLED LIGHT-EMITTING DEVICE, METHOD FOR PREPARING OLED LIGHT-EMITTING DEVICE, AND LAMP

(71) Applicants: Chengdu BOE Optoelectronics Technology Co., Ltd., Sichuan (CN); BOE Technology Group Co., Ltd., Beijing (CN)

(72) Inventors: Wenkang Wang, Beijing (CN); Hang Dong, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 455 days.

(21) Appl. No.: 17/425,190

(22) PCT Filed: Jun. 23, 2020

(86) PCT No.: PCT/CN2020/097680
§ 371 (c)(1),
(2) Date: Jul. 22, 2021

(87) PCT Pub. No.: WO2020/259491
PCT Pub. Date: Dec. 30, 2020

(65) Prior Publication Data
US 2022/0059791 A1  Feb. 24, 2022

(30) Foreign Application Priority Data
Jun. 28, 2019 (CN) .......................... 201910573646.1

(51) Int. Cl.
*H10K 50/125* (2023.01)
*F21K 9/20* (2016.01)
(Continued)

(52) U.S. Cl.
CPC .............. *H10K 50/125* (2023.02); *F21K 9/20* (2016.08); *H10K 59/122* (2023.02); *H10K 71/00* (2023.02);
(Continued)

(58) Field of Classification Search
CPC ............... H10K 50/125; H10K 59/122; H10K 59/1201; F21K 9/20
See application file for complete search history.

(56) References Cited

U.S. PATENT DOCUMENTS

2007/0085787 A1* 4/2007 Kim ..................... H10K 59/179
345/82
2012/0112988 A1 5/2012 Nakanishi et al.
(Continued)

FOREIGN PATENT DOCUMENTS

CN 102376895 A 3/2012
CN 202583659 U 12/2012
(Continued)

OTHER PUBLICATIONS

Written Opinion dated Aug. 31, 2020, issued in counterpart International application No. PCT/CN2020/097680, with English Machine Translation. (6 pages).
(Continued)

*Primary Examiner* — Christine A Enad
(74) *Attorney, Agent, or Firm* — WHDA, LLP

(57) ABSTRACT

An OLED light emitting device, a method for fabricating an OLED light emitting device and a lamp device. The OLED light emitting device includes: a substrate; a plurality of organic light emitting diodes, wherein the plurality of organic light emitting diodes are located on a same one side of the substrate; and a plurality of regulating resistors, wherein the regulating resistors are connected to the organic light emitting diodes; wherein areas of luminescent layers of
(Continued)

the plurality of organic light emitting diodes are not completely equal.

18 Claims, 4 Drawing Sheets

(51) Int. Cl.
  *F21Y 115/15* (2016.01)
  *H10K 59/12* (2023.01)
  *H10K 59/122* (2023.01)
  *H10K 71/00* (2023.01)
(52) U.S. Cl.
  CPC ....... *F21Y 2115/15* (2016.08); *H10K 59/1201* (2023.02)

(56) References Cited

U.S. PATENT DOCUMENTS

| | | |
|---|---|---|
| 2014/0376252 A1 | 12/2014 | Ohmi |
| 2016/0120005 A1 | 4/2016 | Wu et al. |
| 2017/0125490 A1 | 5/2017 | Li et al. |
| 2017/0287988 A1* | 10/2017 | Lee .......... H10K 50/19 |
| 2018/0190210 A1 | 7/2018 | Chung |
| 2020/0006440 A1 | 1/2020 | Liao |
| 2020/0098320 A1 | 3/2020 | Huang |
| 2020/0152694 A1* | 5/2020 | Lee .......... H01L 33/50 |
| 2020/0286962 A1* | 9/2020 | Lee .......... H10K 59/131 |

FOREIGN PATENT DOCUMENTS

| | | |
|---|---|---|
| CN | 104235723 A | 12/2014 |
| CN | 105552068 A | 5/2016 |
| CN | 106653792 A | 5/2017 |
| CN | 107275360 A | 10/2017 |
| CN | 108735790 A | 11/2018 |
| CN | 108878496 A | 11/2018 |
| CN | 109148509 A | 1/2019 |
| CN | 208737865 U | 4/2019 |
| JP | 2004-333570 A | 11/2004 |
| JP | 2005-141149 A | 6/2005 |
| JP | 2014137489 A | 7/2014 |
| TW | 201616192 A | 5/2016 |

OTHER PUBLICATIONS

International Search Report dated Aug. 31, 2020, issued in counterpart International application No. PCT/CN2020/097680, with English Machine Translation. (5 pages).

Office Action and Search Report dated Apr. 16, 2021, issued in counterpart CN Application No. 201910573646.1, with English Machine Translation. (25 pages).

Office Action dated Sep. 9, 2021, issued in counterpart CN Application No. 201910573646.1, with English Machine Translation. (20 pages).

* cited by examiner

OLED LIGHT-EMITTING DEVICE, METHOD FOR PREPARING OLED LIGHT-EMITTING DEVICE, AND LAMP

CROSS REFERENCE TO RELEVANT APPLICATIONS

The application claims priority to Chinese Patent Application No. 201910573646.1, titled "OLED LIGHT-EMITTING DEVICE, METHOD FOR PREPARING OLED LIGHT-EMITTING DEVICE, AND LAMP" and filed to the State Patent Intellectual Property Office on Jun. 28, 2019, the contents of which are incorporated herein by reference in its entirety.

TECHNICAL FIELD

The present disclosure relates to the field of electronic devices, and particularly relates to an OLED light emitting device, a method for fabricating an OLED light emitting device and a lamp device.

BACKGROUND

With the development of the technique of OLEDs, organic light emitting diodes are applied in various fields, to realize the function of light emission or displaying. Particularly, because OLEDs have the principle of self-illumination, and can realize the displaying of various different colors, they are extensively applied in the field of displaying, to fabricate various displaying devices, for example, the screen of a computer or a television set, the display panel of electronic devices such as a mobile phone and a bracelet, and so on. Moreover, organic light emitting diodes are further applied to manufacture various illuminating devices.

SUMMARY

In an aspect of the present application, the present application provides an OLED light emitting device. The OLED light emitting device comprises: a substrate; a plurality of organic light emitting diodes, wherein the plurality of organic light emitting diodes are located on a same one side of the substrate; and a plurality of regulating resistors, wherein the regulating resistors are connected to the organic light emitting diodes; wherein areas of luminescent layers of the plurality of organic light emitting diodes are not completely equal.

According to an embodiment of the present application, resistance values of the regulating resistors are configured so that electric-current densities of the plurality of organic light emitting diodes under an equal voltage are equal.

According to an embodiment of the present application, a sheet resistance of a material of the regulating resistors is not less than 1500 ohms.

According to an embodiment of the present application, the material of the regulating resistors is an electrically conductive metal oxide.

According to an embodiment of the present application, each of the organic light emitting diodes is connected to merely one of the regulating resistors, each of the regulating resistors is connected to merely one of the organic light emitting diodes, a ratio of areas of luminescent layers of any two of the organic light emitting diodes is k, and a ratio of resistance values of two of the regulating resistors that are connected to the two organic light emitting diodes whose ratio of the areas of the luminescent layers is k is 1/k.

According to an embodiment of the present application, each of the regulating resistors comprises a resistor layer located on the substrate, and the resistor layer has one side that is lap-joined to an electrode of the organic light emitting diode, and has other side that is connected to a metal trace.

According to an embodiment of the present application, the OLED light emitting device further comprises: a pixel defining layer, wherein the pixel defining layer is located on one side of the substrate that is provided with the organic light emitting diodes.

According to an embodiment of the present application, the plurality of organic light emitting diodes are arranged on the substrate in an array, and areas of luminescent layers of organic light emitting diodes that are located at edges of the substrate are less than areas of luminescent layers of organic light emitting diodes that are located in a center of the substrate.

According to an embodiment of the present application, cross sections along a plane where the substrate is located of the luminescent layers of the organic light emitting diodes that are located at the edges of the substrate have arc-shaped or oblique-line-shaped edges, and the arc-shaped or oblique-line-shaped edges are located on one side closer to the edges of the substrate.

According to an embodiment of the present application, colors of the luminescent layers of the plurality of organic light emitting diodes are the same, each of the organic light emitting diodes is connected to merely one of the regulating resistors, and each of the regulating resistors is connected to merely one of the organic light emitting diodes.

In another aspect of the present application, the present application provides a method for fabricating an OLED light emitting device. The method comprises: forming a plurality of regulating resistors on a substrate; forming a plurality of organic light emitting diodes on one side of the substrate that is provided with the regulating resistors, wherein areas of luminescent layers of at least two organic light emitting diodes of the plurality of organic light emitting diodes are not equal; and connecting the regulating resistors to the organic light emitting diodes.

According to an embodiment of the present application, the method further comprises: forming an electrode layer on the substrate, and by using a first patterning process, forming anodes of the plurality of organic light emitting diodes; forming a resistor layer, and by using a second patterning process, forming a plurality of regulating resistors that are connected to the anodes, wherein one end of the regulating resistors are lap-joined to the anodes; and forming a plurality of luminescent layers that are arranged separately, wherein the luminescent layers are connected to the anodes.

According to an embodiment of the present application, the organic light emitting diodes and the regulating resistors are connected one to one, a ratio of areas of luminescent layers of any two of the organic light emitting diodes is k, and, by controlling shapes of masks in the first patterning process and the second patterning process, areas of luminescent layers of the organic light emitting diodes and areas of the regulating resistors are controlled, so that a ratio of resistance values of two of the regulating resistors that are connected to the two organic light emitting diodes whose ratio of the areas of the luminescent layers is k is 1/k.

According to an embodiment of the present application, the step of forming the plurality of luminescent layers that are arranged separately comprises: providing a pixel defining layer on one side of the substrate that is provided with the regulating resistors, and forming a plurality of instances of the luminescent layers within pixel regions defined by the pixel defining layer.

According to an embodiment of the present application, the material of the luminescent layers may be printed at the pixel regions by ink-jet printing, to form the plurality of luminescent layers having the same emitted-light color.

According to an embodiment of the present application, the pixel defining layer defines on the substrate a plurality of instances of the pixel regions that are arranged in an array, areas of pixel regions that are located at edges of the substrate are less than areas of pixel regions that are located in a center of the substrate, and orthographic projections on the substrate of the pixel regions that are located at the edges of the substrate have arc-shaped or oblique-line-shaped edges.

According to an embodiment of the present application, before formation of the electrode layer, the method further comprises: a step of forming a plurality of metal traces on the substrate, and while forming the regulating resistors, lap-joining one end of the regulating resistors to the metal traces, and lap-joining the other end to the anodes.

In yet another aspect of the present application, the present application provides a lamp device. The lamp device comprises the OLED light emitting device stated above.

According to an embodiment of the present application, the lamp device is a car lamp, and an edge of the car lamp is arc-shaped or oblique-line-shaped.

DESCRIPTION OF THE REFERENCE NUMBERS

Figure 1:
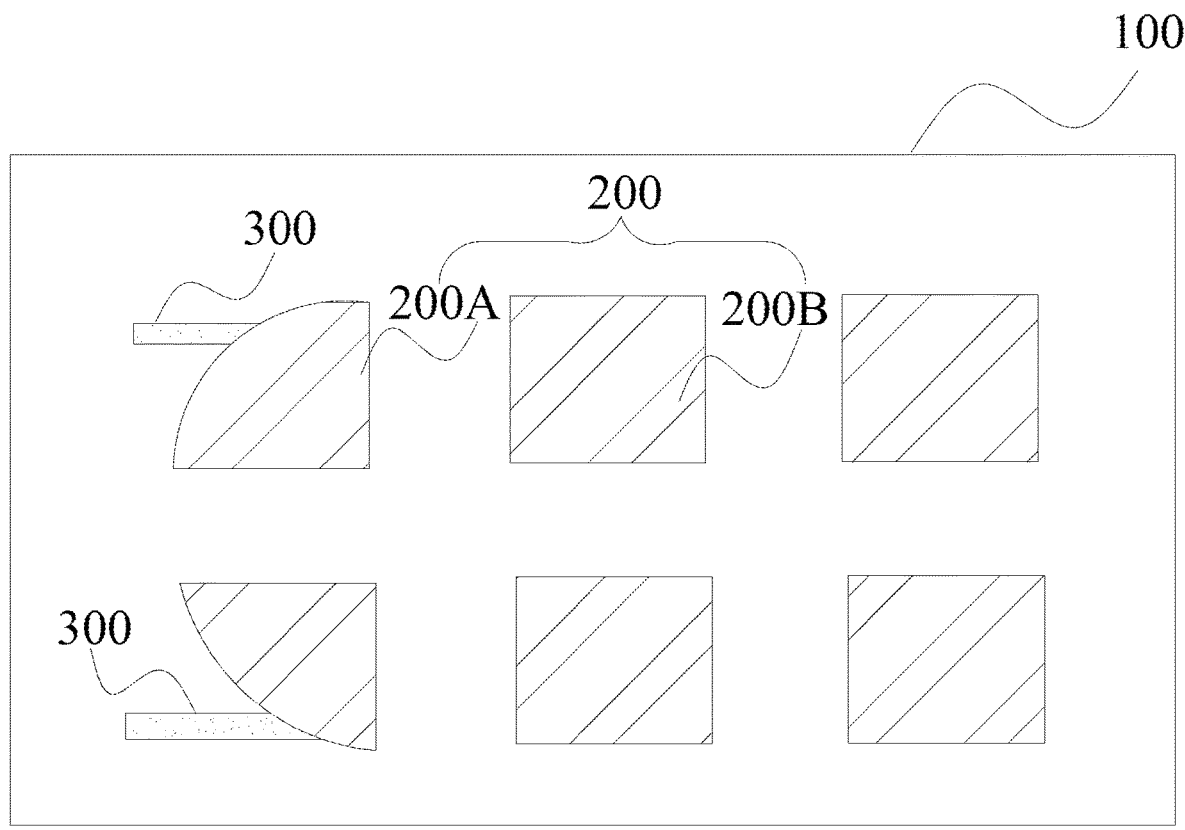
FIG. 1 shows a schematic structural diagram of the OLED light emitting device according to an embodiment of the present application.

100: substrate; 200: organic light emitting diodes; 210: anode; 300: regulating resistors; 400: metal trace; 500: pixel defining layer; 1000: lamp device; 1100: housing; and 1200: OLED light emitting device.

DETAILED DESCRIPTION

The embodiments of the present application will be described in detail below, and the examples of the embodiments are illustrated in the drawings, wherein the same or similar reference numbers throughout the drawings indicate the same or similar elements or elements having the same or similar functions. The embodiments described below with reference to the drawings are exemplary, are merely intended to interpret the present application, and should not be construed as a limitation on the present application.

In an aspect of the present application, the present application provides an OLED light emitting device. Referring to FIG. 1, the OLED light emitting device may comprise: a substrate 100, and a plurality of organic light emitting diodes 200 provided on the substrate 100 (for example, 200A and 200B shown in the figure). All of the plurality of organic light emitting diodes 200 are located on the same one side of the substrate 100, and the areas are not completely equal. In other words, the areas of the luminescent layers of at least two organic light emitting diodes 200 of the plurality of organic light emitting diodes 200 are not equal. The substrate 100 is further provided with a plurality of regulating resistors 300, and the regulating resistors 300 are connected to the organic light emitting diodes 200. Accordingly, the electric-current densities of the plurality of organic light emitting diodes can be controlled to be equal by using the regulating resistors when the areas of the plurality of organic light emitting diodes are not completely equal, whereby the light-emission uniformity of the OLED light emitting device can be ensured by using the simple structure without providing a complicated backplane electric circuit.

In order to facilitate the comprehension, firstly, the principle by which the OLED light emitting device can realize the above advantageous effects will be briefly described below.

As stated above, the OLED light emitting device according to the embodiments of the present application has a plurality of organic light emitting diodes, and the areas of the plurality of organic light emitting diodes are not completely equal. In order to prevent that imperfects at some positions of the light emitting device result in that the entire light emitting face has imperfects such as short circuit and thus cannot realize illumination or displaying, OLED light emitting devices are mostly provided with a plurality of organic light emitting diodes arranged in an array. Taking illuminating devices such as a car lamp as an example, such a design can, when some of the organic light emitting diodes have imperfects such as short circuit and cannot be lightened, still ensure that the whole of the entire car lamp has a sufficient illumination brightness. In cases in which a car lamp and so on have abnormally shaped boundaries (for example, an oblique-line shape or an arc shape), that might result in that some pixels with irregular shapes emerge at the boundaries, and in turn the organic light emitting diodes corresponding to the pixel units also have abnormally shaped boundaries (for example, 200A shown in FIG. 1). It is difficult to ensure that the areas of the organic light emitting diodes having the abnormally shaped boundaries can be equal to the area of the pixels located in the center of the light emitting device having the regular shape. In other words, the areas of at least two organic light emitting diodes of the plurality of organic light emitting diodes are different, for example, the organic light emitting diode 200A and the organic light emitting diode 200B shown in FIG. 1. When the voltages applied between the cathodes and the anodes of the plurality of organic light emitting diodes are equal, the above-described difference in the areas results in that the electric-current densities of the plurality of organic light emitting diodes are also different. Accordingly, if the electric-current densities of the plurality of organic light emitting diodes are not controlled, that results in non-uniformity of the light emission of the light emitting device.

The methods of solving the above problems may include two solutions of reducing the areas of the pixels, and controlling the electric-current densities of the plurality of organic light emitting diodes. Regarding the solution of reducing the pixel areas, the area of each of the single pixel points (single organic light emitting diodes) may be made sufficient small, thereby splicing to obtain an abnormally shaped boundary by using a plurality of organic light emitting diodes having equal areas. However, the implementation of such a solution will result in that the areas of the single organic light emitting diodes are highly reduced, which results in the sharp increasing of the production cost. Moreover, currently, the regulation of the electric-current densities of the organic light emitting diodes are realized mostly by relying on a more complicated backplane electric circuit, for example, by using an electric-circuit structure having a plurality of thin-film transistors (TFT) and capacitors (for example, comprising 7 TFTs and 1 capacitor), and by regulating the length-width ratio of the channels of the driving TFTs in it, to change the switching characteristic of the driving TFTs, to in turn realize controlling the electric currents of the organic light emitting diodes, and, according to the area of the luminescent layer of each of the organic light emitting diodes, determining the length-width ratios of a plurality of driving TFTs, and in turn making the electric currents of each of the organic light emitting diodes different with the difference between their light-emitting areas, to finally achieve the purpose of controlling the electric-current densities of the plurality of organic light emitting diodes to be equal.

Apparently, both of the above two solutions involve a more complicated structure. The OLED displaying device according to the embodiments of the present application, by adding the regulating resistors, can realize the controlling on the electric-current density of each of the organic light emitting diodes without providing a backplane electric circuit. The organic light emitting diodes are connected to the regulating resistors, and the voltage outputted by an external electric circuit may be equivalent to being applied between the diodes and the resistors that are connected in series. Therefore, the resistance values of the regulating resistors connected to the different organic light emitting diodes can be set according to the light-emitting areas of the different organic light emitting diodes, whereby the voltage values that are actually applied to the cathodes and the anodes of the two organic light emitting diodes having the different areas are not equal, to finally make the electric-current densities of the plurality of organic light emitting diodes matched, thereby in turn ensuring the light-emission uniformity of the OLED displaying device.

It should be understood particularly that the "area of an organic light emitting diode" used in the present application refers to the light-emitting area of the organic light emitting diode; for example, it refers to the area of the luminescent layer in the organic light emitting diode, or refers to the cross-sectional area of the luminescent layer, i.e., the cross-sectional area in the direction along the plane where the substrate is located.

According to an embodiment of the present application, the plurality of organic light emitting diodes may be connected to an external electric circuit by interconnected leads. In other words, the plurality of organic light emitting diodes of the OLED light emitting device may be connected to the same one voltage side to be controlled collectively, and by controlling the resistance values of the plurality of regulating resistors 300, the electric-current densities of the plurality of organic light emitting diodes 200 under that voltage can be equal. Accordingly, the plurality of organic light emitting diodes can be connected to the external electric circuit easily by components such as connecting terminals, and no complicated backplane electric circuit is required to be provided, which ensures that the electric-current densities of the plurality of organic light emitting diodes having unequal areas are equal.

Figure 3:
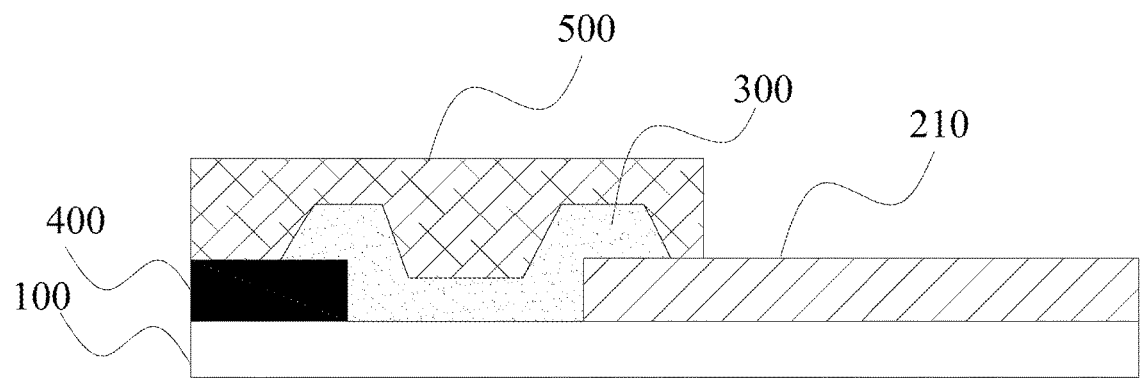
FIG. 3 shows a schematic partial structural diagram of the OLED light emitting device according to another embodiment of the present application.

Referring to FIG. 3, the regulating resistor 300 may be of a layered structure that is electrically connected to an organic light emitting diode 200, and is formed by a material having a certain sheet resistance. Accordingly, in an aspect, the regulating resistor 300 can be easily provided in the fabrication, and, in another aspect, by using the layered resistor, the resistance value of each of the regulating resistors 300 can be easily controlled by controlling the area of the regulating resistor 300. According to a particular embodiment of the present application, the sheet resistance of the material forming the regulating resistors 300 may be not less than 1500 ohms. Accordingly, the electric-current densities can be regulated well, and at the same time the internal resistance of the entire light emitting device is not significantly increased. For example, the material forming the regulating resistors comprises an electrically conductive metal oxide, such as ITO. Accordingly, the performance of the OLED light emitting device can be further improved. Here, it should be understood particularly that FIG. 3 shows a schematic cross-sectional view of some of the components of the OLED light emitting device in the direction perpendicular to the plane where the substrate 100 is located, and the shape of the regulating resistor 300 shown in the figure is merely illustrative, and should not be understood as an limitation on the particular shape of the regulating resistor 300. For example, the regulating resistor 300 may be formed by using an ITO material, and the fabricating method may comprise, by using techniques including but not limited to sputter coating, forming one layer of the ITO material, then, by using a patterning process (for example, providing a mask and etching), forming an ITO block that has a certain area and is connected to an electrode of the organic light emitting diode 200, and in turn forming the regulating resistor 300. The shape shown in FIG. 3 (for example, the inclining side wall) is merely a schematic structural diagram for illustrating the regulating resistor 300 formed after the processing by using processes such as sputtering deposition and etching.

Figure 2:
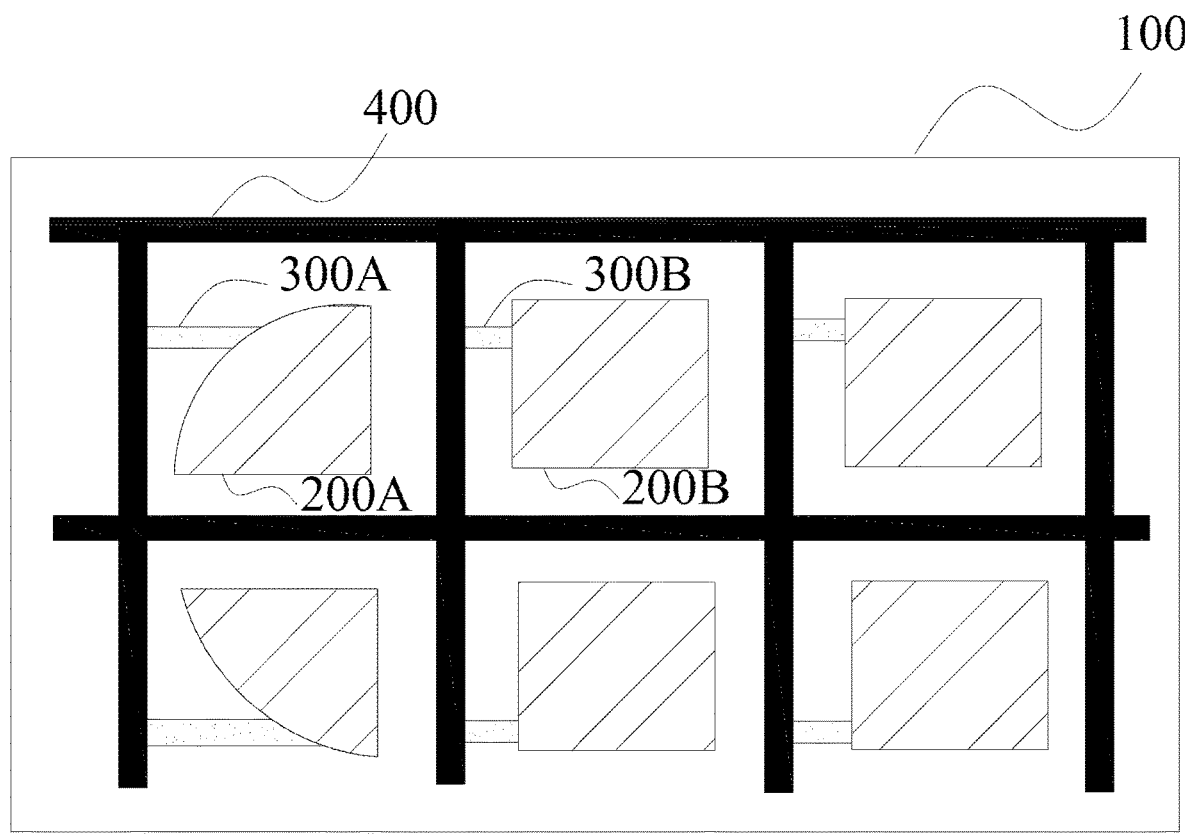
FIG. 2 shows a schematic structural diagram of the OLED light emitting device according to another embodiment of the present application.

As stated above, each of the regulating resistors 300 may comprise a resistor layer located on the substrate. Accordingly, the resistance values of the regulating resistors can be easily controlled by controlling the areas of the resistor layers. Referring to FIGS. 2 and 3, one side of the regulating resistor 300 may be lap-joined to an electrode (for example, the anode 210 shown in FIG. 3) of the organic light emitting diode 200, and the other side may be connected to a metal trace 400. The metal trace 400 may be configured to be connected to the external electric circuit; in other words, the substrate 100 may have a plurality of metal traces 400 thereon, one end of the metal traces 400 may be connected to the regulating resistors 300, and the other end may extend to the edge of the substrate 100, to serve as the connecting terminals for the connection to the external electric circuit (for example, a controlling integrated circuit connected to a flexible circuit board, and so on). Accordingly, the performance of the OLED light emitting device can be further improved.

Figure 4:
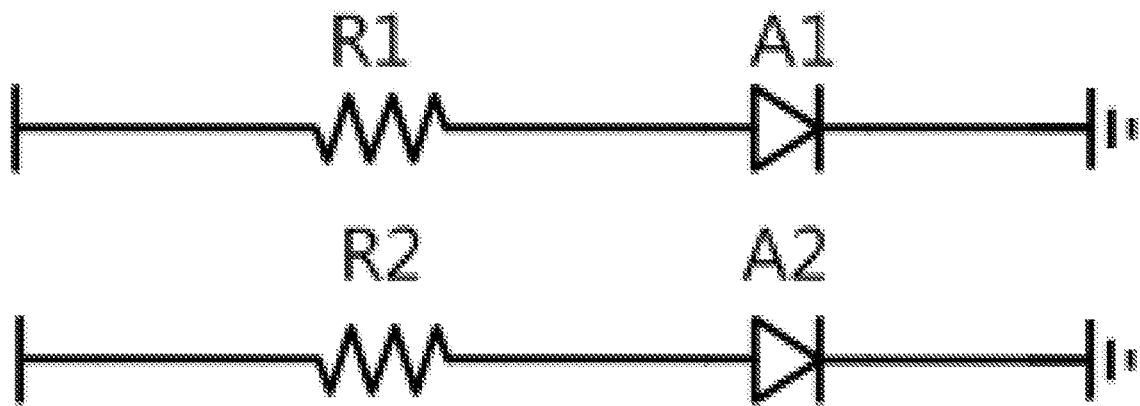
FIG. 4 shows an equivalent circuit diagram of part of the structure of the OLED light emitting device according to an embodiment of the present application.

The quantity and the particular structure of the regulating resistors 300 are not particularly limited, as long as the above functions can be realized. For example, the device may comprise a plurality of regulating resistors 300, and the quantity of the regulating resistors 300 may be less than the quantity of the organic light emitting diodes 200. Alternatively, referring to FIG. 2, the quantity of the regulating resistors 300 may also be equal to the quantity of the organic light emitting diodes 200, wherein each of the organic light emitting diodes is connected to one of the regulating resistors, and each of the regulating resistors is connected to one of the organic light emitting diodes; in other words, they are connected one to one. As stated above, when no voltage controlling electric circuit (for example, the above-described electric circuit comprising 7 TFTs and 1 capacitor) is provided between the external voltage source and the organic light emitting diodes, the voltage outputted by the voltage source is not regulated by a voltage controlling electric circuit, and is directly applied between the anodes and the cathodes of the organic light emitting diodes, and the electric currents of the light emitting diodes are directly related to the resistances between the anodes and the cathodes. However, when the regulating resistors 300 are between the voltage source and the organic light emitting diodes, the electric currents of the light emitting diodes are related to the sum between the resistances of the light emitting diodes 200 themselves and the resistance values of the regulating resistors 300. Moreover, the light emitting diodes, which have the luminescent layers having different areas, have different resistance values themselves. Therefore, the regulating resistors 300 may, according to the areas of the different light emitting diodes 200, be provided at the positions of the light emitting diodes 200 that require resistance compensation, to reach the effect that the electric-current densities of the plurality of light emitting diodes 200 are equal or approximately equal. A person skilled in the art can understand that, because the areas of the light emitting diodes 200 are not completely equal, in order to ensure that the electric-current densities of the plurality of light emitting diodes 200 are equal, the resistance values of the plurality of regulating resistors 300 may also not be completely equal. Alternatively, the organic light emitting diodes 200 and the regulating resistors 300 may also be correspondingly connected one to one. In other words, the quantities of the organic light emitting diodes 200 and of the regulating resistors 300 may be equal. At this point, the ratio of the areas of the luminescent layers of any two of the organic light emitting diodes may be k, and the ratio of the resistance values of two of the regulating resistors that are connected to those two organic light emitting diodes may be 1/k. In other words, taking the structure shown in FIG. 2 as an example, the ratio of the luminescent layers of the light emitting diode 200B to the light emitting diode 200A is k, and then the ratio of the resistance values of the regulating resistor 300B connected to the light emitting diode 200B to the regulating resistor 300A connected to the light emitting diode 200A is 1/k. Accordingly, in an aspect, the process of fabricating the regulating resistors 300 can be simplified, wherein it is not required to particularly determine where the regulating resistors 300 are required to be formed. In another aspect, the process of determining the resistance values of the regulating resistors 300 can be simplified. Particularly:

Taking the regular light emitting diode 200B and the irregular light emitting diode 200A shown in FIG. 2 as an example, the area of the irregular light emitting diode 200A is $A_1$, and the area of the regular light emitting diode 200B is $A_2$ wherein $A_1=k \times A_2$. Referring to FIG. 4, the light emitting diode 200B and the light emitting diode 200A, and the equivalent circuit of the two regulating resistors 300A and 300B connected to them, may be approximately considered as comprising two devices that are connected in series (for example, the resistor R1 (may correspond to 300A in FIG. 2), the diode A1 (may correspond to 200A in FIG. 2), the resistor R2 (may correspond to 300B in FIG. 2) and the diode A2 (may correspond to 200B in FIG. 2) shown in FIG. 4). As stated above, the plurality of light emitting diodes may be directly connected to the external electric circuit by interconnected leads, and therefore the voltage across R1 and A1 is equal to the voltage across R2 and A2. Now it is required to make the electric-current densities (J) of the two light emitting diodes equal, i.e., $J_1=J_2$. Furthermore, according to the formulas J=I/A and I=V/R, wherein I is the electric current, A is the area, V is the voltage, R is the resistance, R1 and A1 are connected in series, and R2 and A2 are connected in series, the electric currents I of the light emitting diodes may be replaced with the electric currents flowing through the regulating resistors R. Moreover, if each of the light emitting diodes is connected in series to one of the regulating resistors, then the electric current in each of the light emitting diodes can be replaced with the I=V/R of the regulating resistor. In other words, $J_1=I/A_1$, and $I=V/R_1$, and therefore:

$$J_1=V/(A_1 \times R)1.$$

Similarly, $J_2=V/A_2 \times R_2$

Because, $A_1=k \times A_2$, it can be obtained that $R_1=1/k \times R_2$, i.e., $R_1:R_2=1/k$.

It should be understood particularly that, in the present application, the particular numerical value of k is not limited particularly. For example, the value of k may be not greater than 2, and when the value of k is greater than 2, the luminescent layer having a larger area may be changed into 2 luminescent layers having equal areas. The minimum value of the value of k may be determined according to the ratio of the luminescent layer having the maximum area and the luminescent layer having the minimum area in the light emitting device, for example, less than 0.01.

According to an embodiment of the present application, referring to FIG. 3, the OLED light emitting device may further comprise a pixel defining layer 500. The pixel defining layer is located on one side of the substrate 100 that is provided with the organic light emitting diodes. For example, the components such as the anodes 210 and the regulating resistors 300 of the organic light emitting diodes may be firstly provided on the substrate 100, and an accommodating space may be defined for the luminescent layers subsequently by using the pixel defining layer 500. The plurality of organic light emitting diodes may be arranged on the substrate 100 in an array; in other words, the pixel defining layer 500 may define on the substrate a plurality of pixel regions that are spaced from each other and are arranged in an array. Taking abnormally shaped OLED light emitting devices such as a car lamp as an example, the areas of the luminescent layers of the organic light emitting diodes that are located at the edges of the substrate 100 may be less than the areas of the luminescent layers of the organic light emitting diodes that are located in the center of the substrate, and the luminescent layers of the organic light emitting diodes that are located at the edges of the substrate may have arc-shaped or oblique-line-shaped edges. In other words, the cross section of the organic light emitting diodes in the direction along the plan view where the substrate is located has arc-shaped or oblique-line-shaped edges, and the arc-shaped or oblique-line-shaped edges are located on one side closer to the edges of the substrate. The oblique-line-shaped here is relative to edges of the traditional rectangular and square. Compared with the cross section of the organic light emitting diode located at the center of the substrate along the direction of the plan view where the substrate is located, at least one side of the cross section of the organic light emitting diode located at the edge along the direction of the plan view where the substrate is located is the arc-shaped or the oblique-line-shaped that is not perpendicular to the adjacent side, or the oblique-line-shaped may be a broken line composed of a plurality of oblique lines, or the like. Accordingly, the center position of the OLED light emitting device may be formed by a plurality of organic light emitting diodes having a regular shape, which can save the area occupied by the components that do not emit light, such as the traces, and accordingly can improve the light-emission effect of the OLED light emitting device.

According to an embodiment of the present application, the colors of the luminescent layers of the plurality of organic light emitting diodes may be the same. Accordingly, the fabricating process of forming the organic light emitting diodes can be simplified, and has a low requirement on the prevention of cross color between the luminescent layers having the different colors. It is merely required to provide the pixel defining layer, and form the luminescent layers having the same color by techniques including but not limited to ink-jet printing.

Figure 5:
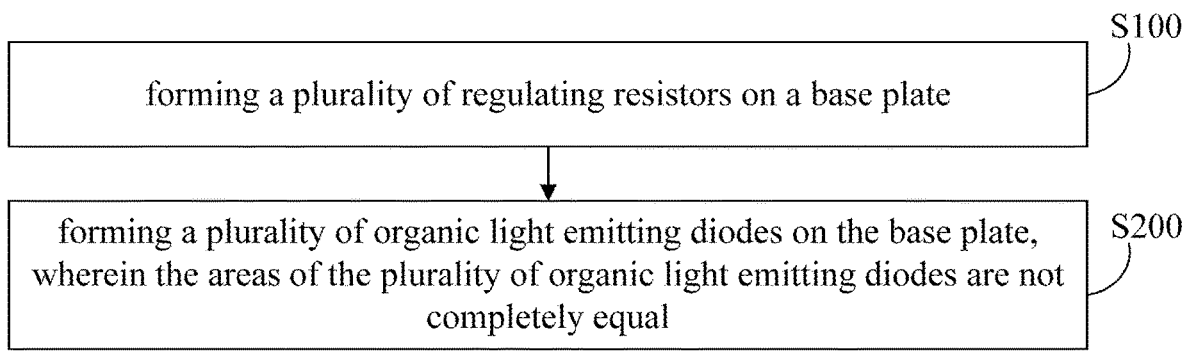
FIG. 5 shows a schematic flow chart of the method for fabricating an OLED light emitting device according to an embodiment of the present application.

In another aspect of the present application, the present application provides a method for fabricating an OLED light emitting device. The OLED light emitting device fabricated by using the method can have all of the features and the advantages of the above-described OLED light emitting device, which is not discussed here further. Referring to FIG. 5, the method comprises:

S100: forming a plurality of regulating resistors on a substrate.

According to an embodiment of the present application, in this step, firstly, the plurality of regulating resistors are formed on the substrate. As stated above, the regulating resistors are electrically connected to the light emitting diodes, and therefore the regulating resistors may be connected to the anodes or the cathodes of the light emitting diodes. Referring to FIG. 3, the regulating resistor 300 is firstly formed. The electric connection between the regulating resistor 300 and an electrode of the light emitting diode (for example, the anode 210 shown in the figure) can be easily realized by modes such as lap joining, and the substrate 100, at this point, can support the regulating resistor 300 well, which can prevent that, after the light emitting diode has been formed, the regulating resistor 300 is formed on a stacked structure (which may comprise the pixel defining layer 500) of a poor rigidity.

Particularly, the method may comprise firstly forming an electrode layer on the substrate, and by using a first patterning process, forming the anodes of the plurality of organic light emitting diodes; subsequently forming the resistor layer, and by using a second patterning process, forming a plurality of regulating resistors that are connected to the anodes, wherein one end of the regulating resistors are lap-joined to the anodes; and, finally, by performing operations such as the provision of the pixel defining layer, forming the plurality of luminescent layers that are arranged separately. Accordingly, the plurality of regulating resistors can be easily formed. For example, the method may comprise firstly forming one metal layer on a glass substrate by film coating, and etching out a corresponding pattern, to form the metal traces; subsequently, vapor-depositing an anode layer on the glass substrate, and etching to form a plurality of anodes; and subsequently, forming one layer of an electrically conductive material, for example ITO, and by using a second patterning process, forming the regulating resistors, to connect the metal traces and the anodes.

According to an embodiment of the present application, the organic light emitting diodes and the regulating resistors may be correspondingly connected one to one; in other words, one organic light emitting diode is connected to one regulating resistor, and each of the regulating resistors is merely connected to one of the organic light emitting diodes. This step may also comprise, by controlling the shapes of the masks in the first patterning process and the second patterning process, controlling the areas of the luminescent layers in the organic light emitting diodes, and the areas of the regulating resistors. Accordingly, the resistance values of the regulating resistors can be easily controlled, and the areas of the luminescent layers of the organic light emitting diodes and the resistance values of the regulating resistors can be easily controlled to satisfy that: the ratio of the areas of the luminescent layers of any two of the organic light emitting diodes is k, and the ratio of the resistance values of two of the regulating resistors that are connected to those two organic light emitting diodes may be 1/k.

S200: forming a plurality of organic light emitting diodes on the substrate, wherein the areas of the plurality of organic light emitting diodes are not completely equal.

According to an embodiment of the present application, in this step, the components such as the luminescent layers and the cathodes continue to be fabricated, to form the plurality of organic light emitting diodes, wherein the areas of the plurality of organic light emitting diodes are not completely equal.

Particularly, a plurality of luminescent layers that are arranged separately may be formed on the anodes. For example, this step may comprise firstly providing a pixel defining layer on one side of the substrate that is provided with the regulating resistors, and forming a plurality of instances of the luminescent layers within pixel regions defined by the pixel defining layer. Accordingly, the luminescent layers can be easily formed. According to a particular embodiment of the present application, the material of the luminescent layers may be printed at the pixel regions by ink-jet printing, to form the plurality of luminescent layers having the same emitted-light color. That can avoid using a fine metal mask of a high cost.

According to an embodiment of the present application, in the formation of the pixel defining layer, the method may comprise defining on the substrate a plurality of pixel regions that are arranged in an array, and setting that the areas of the pixel regions that are located at the edges of the substrate are less than the areas of the pixel regions that are located in the center of the substrate. Accordingly, the light emitting diodes whose luminescent layers have lower areas can be formed at the edges of the substrate. It may also be set that the orthographic projections on the substrate of the pixel regions that are located at the edges of the substrate have arc-shaped or oblique-line-shaped edges. Accordingly, abnormally shaped organic light emitting diodes can be formed at the edges of the substrate.

Figure 6:
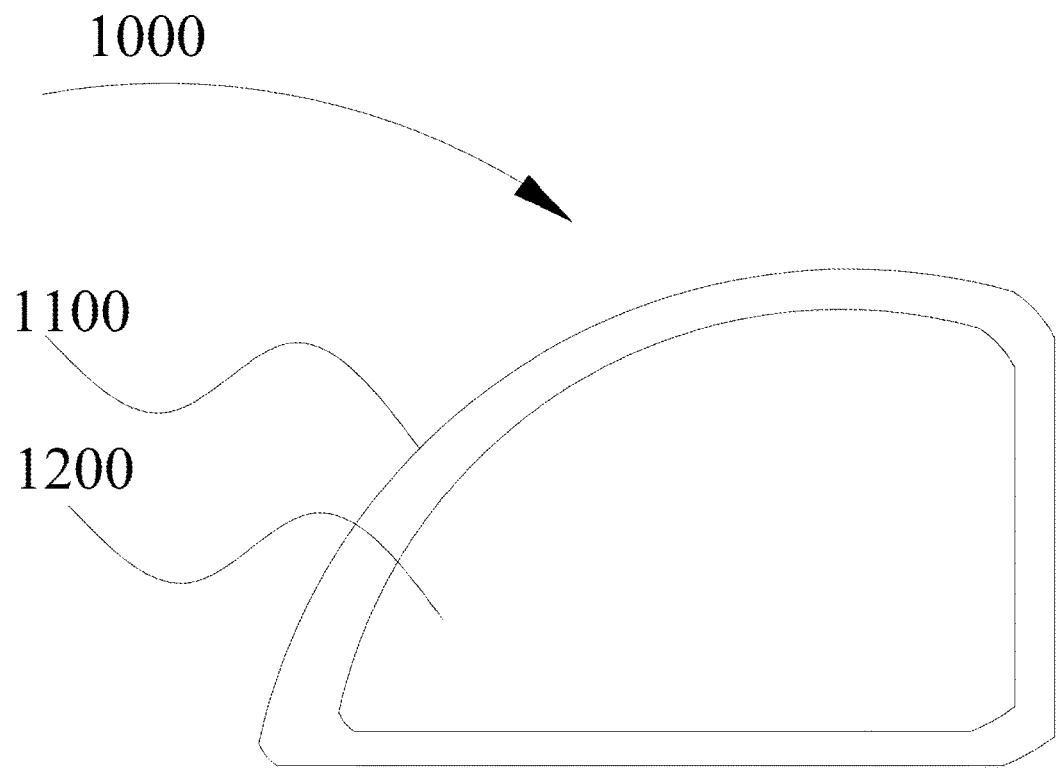
FIG. 6 shows a schematic structural diagram of the illuminating lamp according to an embodiment of the present application.

In yet another aspect of the present application, the present application provides a lamp device, which may also be referred to as an illuminating lamp. The lamp device comprises the OLED light emitting device stated above. Particularly, referring to FIG. 6, the lamp device 1000 may comprise the OLED light emitting device 1200 stated above, and a housing 1100. The housing 1100 may define the accommodating space for the OLED light emitting device 1200, and the light-exiting face of the OLED light emitting device 1200 may be exposed, to realize light emission and illumination. According to an embodiment of the present application, the lamp device may be a car lamp, and the edge of the car lamp may be arc-shaped or oblique-line-shaped.

Figure 7:
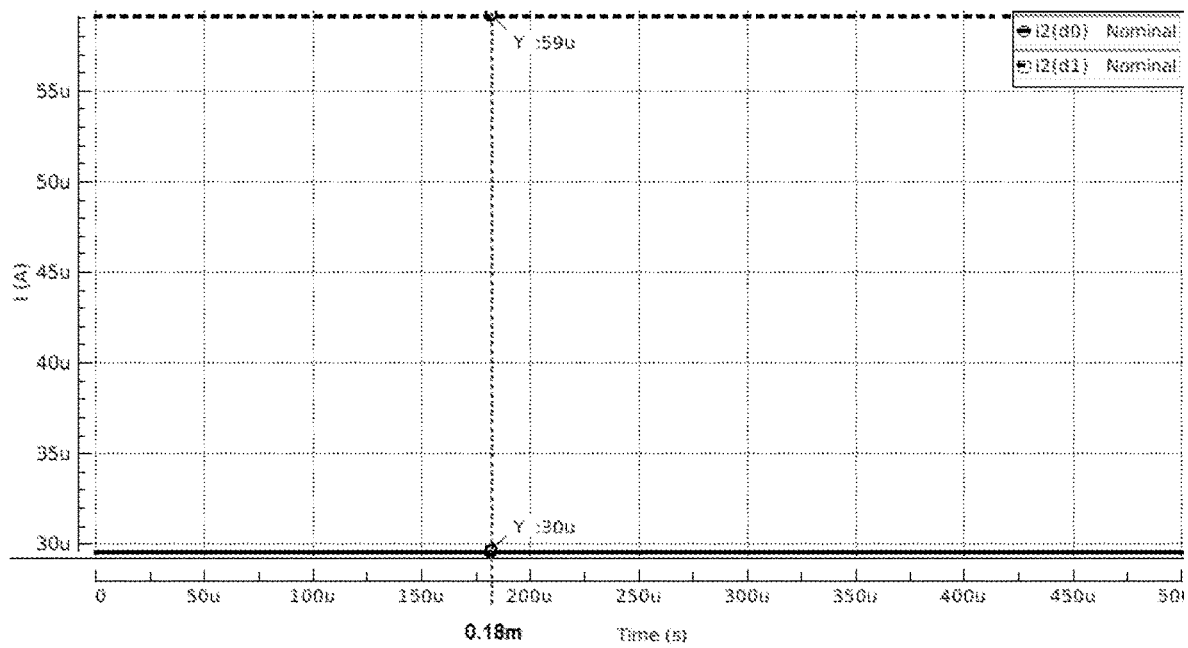
FIG. 7 shows a diagram of the result of a simulation test of the OLED light emitting device according to an embodiment of the present application.

In order to exam the feasibility of the controlling on the uniformity of the electric currents by using the regulating resistors according to the embodiments of the present application, a modeling simulation test is performed to the OLED light emitting device according to the embodiments of the present application. The equivalent circuit is shown in FIG. 4, and it is set that $A_1=45$ nm$^2$, $A_2=90$ nm$^2$, $R_1=1.5$ K$\Omega$ and $R_2=750\Omega$. Referring to FIG. 7, the electric-current values obtained by the simulation are respectively $I_1=30$ μA and $I_2=59$ μA. It is obtained by calculation that the electric-current densities of them are similar, and are close to a theoretical designed value. In other words, the above-described idea of, for pixels of different areas, determining the resistance values of the connected resistors based on the areas of the pixels is feasible, and, by controlling the resistance values of the regulating resistors, the electric-current densities of each of the organic light emitting diodes can be regulated, to realize the effect that OLED light emitting devices such as an abnormally shaped car lamp have uniform light emission.

In the description of the present application, the description referring to the terms "an embodiment", "another embodiment" and so on means that particular features, structures, materials or characteristics described with reference to the embodiment are comprised in at least one of the embodiments of the present application. In the description, the illustrative expressions of the above terms do not necessarily relate to the same embodiment or example. Furthermore, the described particular features, structures, materials or characteristics may be combined in one or more embodiments or examples in a suitable form. Moreover, subject to avoiding contradiction, a person skilled in the art may combine different embodiments or examples described in the description and the features of the different embodiments or examples. In addition, it should be noted that, in the description, the terms "first" and "second" are merely for the purpose of describing, and should not be construed as indicating or implying the degrees of importance or implicitly indicating the quantity of the specified technical features.

Although the embodiments of the present application have already been illustrated and described above, it can be understood that the above embodiments are illustrative, and should not be construed as a limitation on the present application, and a person skilled in the art may make variations, modifications, substitutions and improvements to the above embodiments within the scope of the present application.

The invention claimed is:

1. An OLED light emitting device, wherein the OLED light emitting device comprises:
   a substrate;
   a plurality of organic light emitting diodes, wherein the plurality of organic light emitting diodes are located on a same one side of the substrate; and
   a plurality of regulating resistors, wherein the regulating resistors are connected to the organic light emitting diodes;
   wherein areas of luminescent layers of the plurality of organic light emitting diodes are not completely equal;
   wherein each of the regulating resistors comprises a resistor layer located on the substrate, and the resistor layer has one side that is lap-joined to an electrode of the organic light emitting diode, and has other side that is connected to a metal trace;
   wherein the plurality of organic light emitting diodes are arranged on the substrate in an array, and areas of luminescent layers of organic light emitting diodes that are located at edges of the substrate are less than areas of luminescent layers of organic light emitting diodes that are located in a center of the substrate.

2. The OLED light emitting device according to claim 1, wherein resistance values of the regulating resistors are configured so that electric-current densities of the plurality of organic light emitting diodes under an equal voltage are equal.

3. The OLED light emitting device according to claim 1, wherein a sheet resistance of a material of the regulating resistors is greater than 1500 ohms.

4. The OLED light emitting device according to claim 3, wherein the material of the regulating resistors is an electrically conductive metal oxide.

5. The OLED light emitting device according to claim 1, wherein each of the organic light emitting diodes is connected to merely one of the regulating resistors, each of the regulating resistors is connected to merely one of the organic light emitting diodes, a ratio of areas of luminescent layers of any two of the organic light emitting diodes is k, and a ratio of resistance values of two of the regulating resistors that are connected to the two organic light emitting diodes whose ratio of the areas of the luminescent layers is k is 1/k.

6. The OLED light emitting device according to claim 1, wherein cross sections along a plane where the substrate is located of the luminescent layers of the organic light emitting diodes that are located at the edges of the substrate have arc-shaped or oblique-line-shaped edges, and the arc-shaped or oblique-line-shaped edges are located on one side closer to the edges of the substrate.

7. The OLED light emitting device according to claim 6, wherein colors of the luminescent layers of the plurality of organic light emitting diodes are the same, each of the organic light emitting diodes is connected to merely one of the regulating resistors, and each of the regulating resistors is connected to merely one of the organic light emitting diodes.

8. A method for fabricating an OLED light emitting device, wherein the method comprises:
   forming a plurality of regulating resistors on a substrate;
   forming a plurality of organic light emitting diodes on one side of the substrate that is provided with the regulating resistors, wherein areas of luminescent layers of at least two organic light emitting diodes of the plurality of organic light emitting diodes are not equal; and
   connecting the regulating resistors to the organic light emitting diodes;
   wherein each of the regulating resistors comprises a resistor layer located on the substrate, and the resistor layer has one side that is lap-joined to an electrode of the organic light emitting diode, and has other side that is connected to a metal trace;
   wherein the plurality of organic light emitting diodes are arranged on the substrate in an array, and areas of luminescent layers of organic light emitting diodes that are located at edges of the substrate are less than areas of luminescent layers of organic light emitting diodes that are located in a center of the substrate.

9. The method according to claim 8, wherein the method comprises:
  forming an electrode layer on the substrate, and by using a first patterning process, forming anodes of the plurality of organic light emitting diodes;
  forming a resistor layer, and by using a second patterning process, forming a plurality of regulating resistors that are connected to the anodes, wherein one end of the regulating resistors are lap-joined to the anodes; and
  forming a plurality of luminescent layers that are arranged separately, wherein the luminescent layers are connected to the anodes.

10. The method according to claim 9, wherein the organic light emitting diodes and the regulating resistors are connected one to one, a ratio of areas of luminescent layers of any two of the organic light emitting diodes is k, and, by controlling shapes of masks in the first patterning process and the second patterning process, areas of luminescent layers of the organic light emitting diodes and areas of the regulating resistors are controlled, so that a ratio of resistance values of two of the regulating resistors that are connected to the two organic light emitting diodes whose ratio of the areas of the luminescent layers is k is 1/k.

11. A lamp device, wherein the lamp device comprises the OLED light emitting device according to claim 1.

12. The method according to claim 10, wherein the step of forming the plurality of luminescent layers that are arranged separately comprises:
  providing a pixel defining layer on one side of the substrate that is provided with the regulating resistors, and forming a plurality of instances of the luminescent layers within pixel regions defined by the pixel defining layer.

13. The method according to claim 12, wherein the pixel defining layer defines on the substrate a plurality of instances of the pixel regions that are arranged in an array, and orthographic projections on the substrate of the pixel regions that are located at the edges of the substrate have arc-shaped or oblique-line-shaped edges.

14. The method according to claim 13, wherein the material of the luminescent layers is printed at the pixel regions by ink-jet printing, to form the plurality of luminescent layers having a same emitted-light color.

15. The method according to claim 8, wherein before formation of the electrode layer, the method further comprises: a step of forming a plurality of metal traces on the substrate, and while forming the regulating resistors, lap-joining one end of the regulating resistors to the metal traces, and lap-joining the other end to the anodes.

16. The lamp device according to claim 11, wherein the lamp device is a car lamp.

17. The lamp device according to claim 16, wherein an edge of the car lamp is arc-shaped or oblique-line-shaped.

18. The OLED light emitting device according to claim 1, wherein the OLED light emitting device further comprises: a pixel defining layer, wherein the pixel defining layer is located on one side of the substrate that is provided with the organic light emitting diodes.

* * * * *